United States Patent
Shen et al.

(10) Patent No.: US 10,325,053 B2
(45) Date of Patent: Jun. 18, 2019

(54) TRIANGULAR ROUTING FOR HIGH SPEED DIFFERENTIAL PAIR LENGTH MATCHING

(71) Applicant: Cisco Technology, Inc., San Jose, CA (US)

(72) Inventors: Lin Shen, Saratoga, CA (US);
Yongming Xiong, Fremont, CA (US);
Stephen Ong, Fremont, CA (US);
Shahbaz Mahmood, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 75 days.

(21) Appl. No.: 15/618,455

(22) Filed: Jun. 9, 2017

(65) Prior Publication Data

US 2017/0277820 A1    Sep. 28, 2017

Related U.S. Application Data

(63) Continuation of application No. 14/309,060, filed on Jun. 19, 2014, now Pat. No. 9,690,895.

(51) Int. Cl.
| | |
|---|---|
| G06F 17/50 | (2006.01) |
| H05K 1/00 | (2006.01) |
| H01P 3/00 | (2006.01) |
| H04L 25/02 | (2006.01) |
| H01L 29/00 | (2006.01) |
| H05K 1/02 | (2006.01) |
| H01P 3/08 | (2006.01) |

(52) U.S. Cl.
CPC ....... *G06F 17/5077* (2013.01); *H05K 1/0216* (2013.01); *H01L 2924/0002* (2013.01); *H01P 3/081* (2013.01); *H04L 25/027* (2013.01); *H05K 1/0245* (2013.01); *H05K 2201/09236* (2013.01)

(58) Field of Classification Search
CPC ............... H05K 1/0216; H05K 1/0245; H05K 2201/09236; H01L 2924/0002; H01P 3/081; H04L 25/027; G06F 17/5077
USPC .................................................. 716/126, 130
See application file for complete search history.

(56) References Cited

U.S. PATENT DOCUMENTS

| | | | |
|---|---|---|---|
| 7,022,919 B2 | 4/2006 | Brist et al. | |
| 7,180,011 B1 | 2/2007 | Hall | |
| 8,595,682 B2 | 11/2013 | Byrne et al. | |
| 9,647,052 B2 * | 5/2017 | Youn | H01L 23/4985 |
| 2009/0204934 A1 | 8/2009 | Lin | |

(Continued)

OTHER PUBLICATIONS

Isosceles Triangle.notebook, "Isosceles Triiangles.notebook", Oct. 1, 2012, found at http://www.mjsd.k12.wi.us/Archive/mhs/depts/math%5Cteachers/jarmolowicz/documents/IsoscelesTriangles_001.pdf, pp. 1-3. (Year: 2201).*

(Continued)

*Primary Examiner* — Stacy Whitmore
(74) *Attorney, Agent, or Firm* — Polsinelli PC

(57) ABSTRACT

A method and apparatus for matching the lengths of traces of differential signal pairs. The method includes determining that a first trace is longer than a second trace and modifying the second trace so that the length is substantially equal to the length of the first trace. In some implementations, the second trace can be modified by replacing one or more sections of the trace with two line segments that are substantially equal in length and meet at a vertex that is less than 180 degrees.

20 Claims, 8 Drawing Sheets

(56) References Cited

U.S. PATENT DOCUMENTS

| | | | | |
|---|---|---|---|---|
| 2010/0007429 A1* | 1/2010 | Li | ............... | H05K 1/0245 |
| | | | | 333/5 |
| 2013/0097577 A1* | 4/2013 | Byrne | ............... | G06F 17/5081 |
| | | | | 716/137 |
| 2013/0159959 A1* | 6/2013 | Byrne | ............... | H04B 3/00 |
| | | | | 716/137 |
| 2014/0134798 A1* | 5/2014 | Kim | ............... | H01L 24/19 |
| | | | | 438/109 |
| 2014/0196941 A1* | 7/2014 | Hidaka | ............... | H05K 1/116 |
| | | | | 174/266 |
| 2015/0325901 A1* | 11/2015 | Hidaka | ............... | H05K 3/40 |
| | | | | 333/238 |

OTHER PUBLICATIONS

Simonovich, Lambert, "Practical Fiber Weave Effect Modeling," White Paper—Issue 3, Lamsim Enterprises Inc., Mar. 2, 2012, pp. 1-24.

Riazi, Abe, "Length Matching for High-Speed Differential Pairs," Printed Circuit Design & Manufacture, Feb. 2005, pp. 17-18.

* cited by examiner

TRIANGULAR ROUTING FOR HIGH SPEED DIFFERENTIAL PAIR LENGTH MATCHING

RELATED APPLICATIONS

This application is a continuation of U.S. patent application Ser. No. 14/309,060 filed on Jun. 19, 2014, entitled "Triangular Routing For High Speed Differential Pair Length Matching," the entire contents of which are herein incorporated by reference in its entirety.

TECHNICAL FIELD

This disclosure relates in general to the field of circuit layout, and, in particular, to techniques for routing conductive paths for differential signals.

BACKGROUND

Electronic systems employ different communication interfaces and signaling protocols for sending and receiving data at high speeds. Differential signaling is a technique that is widely adopted in high data rate applications that include computer networking, telecommunications, mobile electronics, and integrated circuit design. Special care must be taken when routing a pair of high-speed differential signals. Each pair of differential signals must be routed on conductive paths that are of the same length. However, design constraints often make it impossible to follow a straight line from the source to the destination. Consequently, there is a need to effectively match the two lengths of the conductive paths for a differential signal pair without affecting the overall performance of the high-speed interface.

BRIEF DESCRIPTION OF THE DRAWINGS

In order to describe the manner in which the above-recited and other advantages and features of the disclosure can be obtained, a more particular description of the principles briefly described above will be rendered by reference to specific examples thereof which are illustrated in the appended drawings. Understanding that these drawings depict only examples of the disclosure and are not therefore to be considered to be limiting of its scope, the principles herein are described and explained with additional specificity and detail through the use of the accompanying drawings in which.

DESCRIPTION OF EXAMPLE EMBODIMENTS

Figure 1:
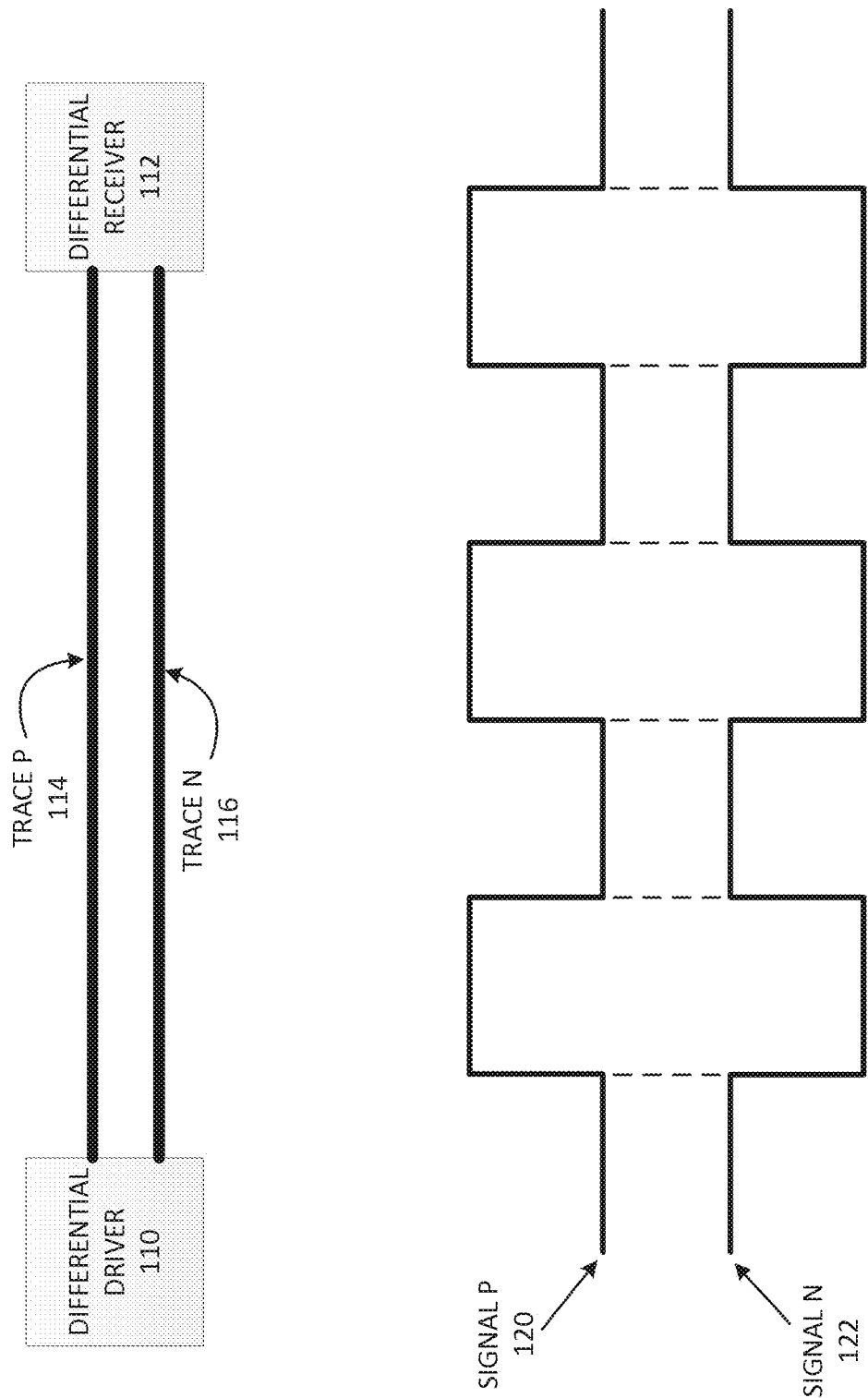
FIG. 1 illustrates an example differential signal interface.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form in order to avoid obscuring the concepts of the subject technology.

The present disclosure describes a technique for routing high-speed differential signals. In particular, the present disclosure relates to matching the length of the conductive paths for a differential pair whose routing path contains turns or bends. The present technology provides a triangular routing approach to obtain required phase and impedance matching while minimizing the insertion loss and transmission delays.

Overview:

In one aspect of the present disclosure, a method for matching a length of a differential pair is disclosed. The method includes determining that the length of a first signal trace is longer than the length of the second signal trace. The second signal trace is modified so that its length is substantially equivalent to the length of the first signal trace. The second signal trace is modified by replacing one or more of its sections with two line segments. The two line segments are substantially equivalent in length and each has a first and a second end. The second end of the first line segment meets the first end of the second line segment to form a vertex.

In another aspect, an apparatus comprising a printed circuit board is disclosed. The printed circuit board has a first signal trace and a second signal trace that are routed on substantially parallel conductive paths as a differential pair. At least one of the two signal traces includes one or more length matching sections. The length matching sections include a first segment and a second segment that are substantially equivalent in length and define a lateral deviation away from the differential pair.

In yet another aspect, a non-transitory computer-readable medium is disclosed. The non-transitory computer-readable medium having stored instructions that, when executed by a processor, cause the processor to determine that the length of a first signal trace is longer than the length of the second signal trace. Modify the second signal trace so that its length is substantially equivalent to the length of the first signal trace. The second signal trace is modified by replacing one or more of its sections with two line segments. The two line segments are substantially equivalent in length and each has a first and a second end. The second end of the first line segment meets the first end of the second line segment to form a vertex.

Detailed Description:

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form in order to avoid obscuring the concepts of the subject technology.

FIG. 1 illustrates an example of a differential pair interface. Using a differential signaling protocol, differential driver 110 can transmit data along trace P 114 and trace N 116 to differential receiver 112. Signal P 120 is the positive signal that is conducted on trace P 114 and signal N 122 is the negative signal that is conducted on trace N 116. Signal P 120 and signal N 122 have equivalent amplitudes and are opposite in polarity. Accordingly, a rising edge on signal P 120 corresponds to a falling edge on signal N 122 and vice-versa.

In FIG. 1, trace P 114 and trace N 116 are routed in straight, parallel lines such that they are identical in length and have a constant, uniform distance between them. This routing is necessary to maintain a consistent propagation delay for both signal P 120 and signal N 122 so that they are 180 degrees out of phase when they arrive at differential receiver 112. Differential receiver 112 relies on this phase difference to properly interpret the data. Furthermore, the phase difference is critical to preserve the noise immunity provided by a differential signaling protocol.

Figure 2:
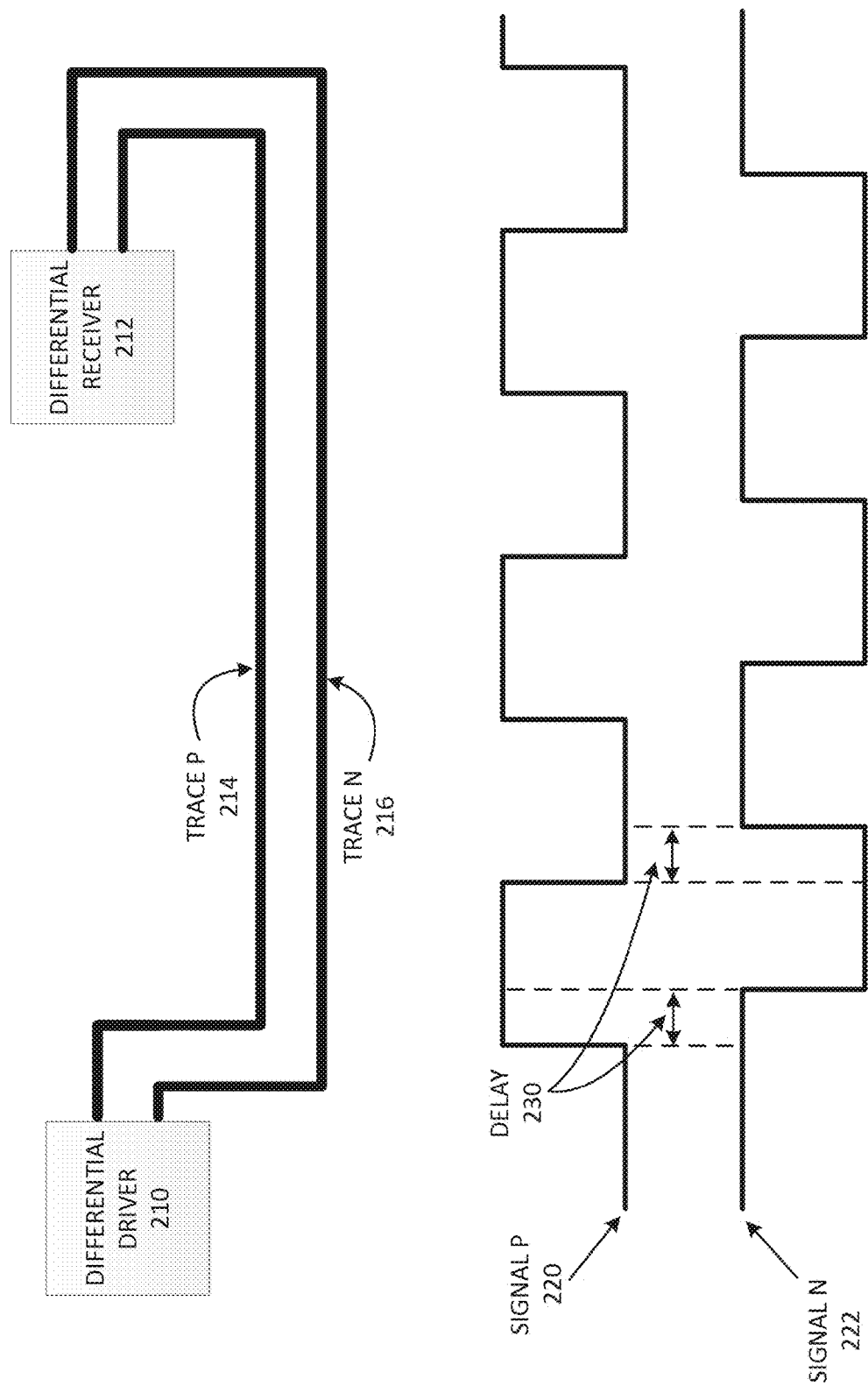
FIG. 2 illustrates an example differential signal interface with different lengths.

FIG. 2 illustrates an example of a differential pair interface with different trace lengths. Contrary to FIG. 1, here trace P 214 and trace N 216 are not routed using straight conductive paths. In this example, trace N 216 is longer than trace P 214 because there are a number of turns in the routing paths between differential driver 210 and differential receiver 212. In many cases turns such as these are unavoidable due to constraints of the design. For example, a densely populated printed circuit board (PCB) may require a number of turns to avoid other integrated circuits or to satisfy mechanical constraints. In addition, differential driver 210 and differential receiver 212 may be packaged in a ball-grid array (BGA) where the respective ball for the differential signals may require additional routing to fan out the signals from the array.

The length mismatch between trace P 214 and trace N 216 can result in a phase shift between signal P 220 and signal N 222. The additional length of trace N 216 can cause longer propagation delay in signal N 222. Consequently, the rising edge of signal P 220 does not correspond with the falling edge of signal N 222, as illustrated in FIG. 2. A delay 230 is the result of the length mismatch between the differential signal traces. Delay 230 can have a negative effect on system performance such as an increase in the bit error rate (BER).

Figure 3:
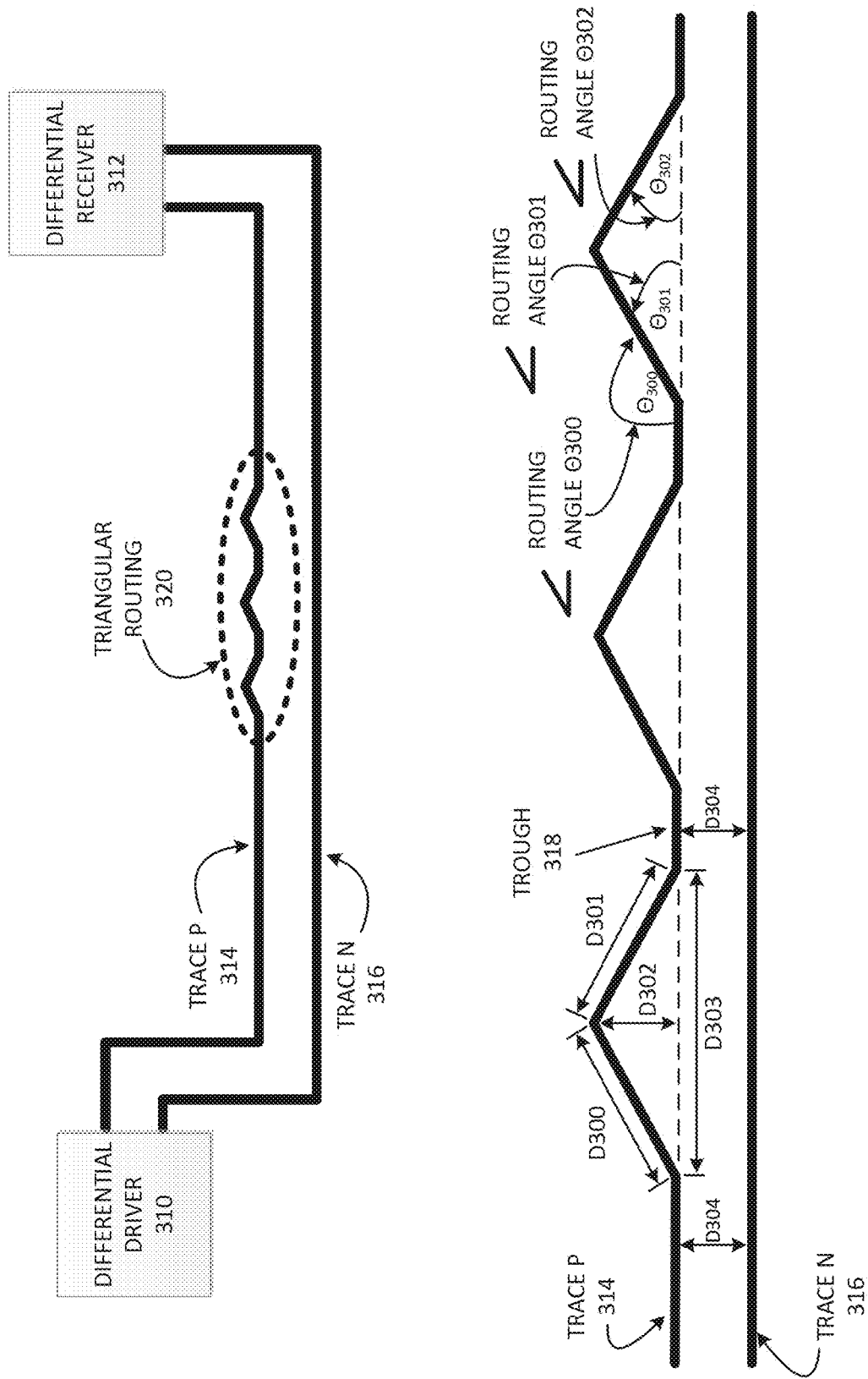
FIG. 3 illustrates an example differential signal interface using the triangular length matching technique of the present disclosure.

FIG. 3 illustrates an example of a differential pair interface with the disclosed triangular routing 320 technique of the present disclosure. Again, this example includes various turns in the routing paths between differential driver 310 and differential receiver 312. These turns cause trace N 316 to be longer than trace P 314. To compensate for the discrepancy in length, trace P 314 is modified to include triangular routing 320.

Triangular routing 320 can replace one or more sections D303 of a conductive path with two trace segments D300 and D301. In some examples, trace segments D300 and D301 are substantially equivalent in length. The parameters associated with triangular routing 320 can vary among different designs. For example, the lengths of segments D300 and D301 and routing angle Θ300 can be adjusted to achieve the desired length matching while optimizing performance, based on each specific design.

D304 represents the differential line spacing between trace P 314 and trace N 316. Differential line spacing D304 can be selected based on, for example, the glass fabric pitch of the PCB material and the desired impedance for the differential pair. Differential line spacing D304 is typically established before commencing routing of the differential pair. After the differential pair is routed, it can be determined if the differential routes are equivalent in length. In FIG. 3, trace P 314 is shorter than trace N 316 and triangular routing 320 can be used to effectively compensate for the shorter length.

The principal parameters associated with triangular routing 320 are lateral offset D302 and routing angles Θ300 and Θ301. Routing angle Θ300 is the angle between a non-modified portion of trace P 314 and the first segment D300. Routing angle Θ301 represents the angle between the first segment D300 and a line that corresponds to the replaced portion of trace P 314. In FIG. 3, the line is designated as D303. Furthermore, routing angle Θ302 represents the angle between the second segment D301 and the line that corresponds to the replaced portion of trace P 314. In some embodiments, routing angles Θ301 and Θ302 can be substantially equivalent.

In one example, lateral offset D302 is chosen according to differential pair line spacing D304. Lateral offset D302 can be selected to be much less than differential line spacing D304. For example, lateral offset D302 can be selected to be between 5% and 20% of differential line spacing D304. Routing angle Θ300 can be selected to be as close to 180 degrees as possible. In one example, routing angle Θ300 is greater than or equal to 145 degrees and less than 180 degrees. Moreover, the selection of routing angle Θ300 will dictate routing angle Θ301. The sum of routing angle Θ300 and routing angle Θ301 is substantially equivalent to 180 degrees. Accordingly, in this example, routing angle Θ301 is greater than 0 degrees and less than or equal to 35 degrees.

Accordingly, in one example, triangular routing 320 can be optimized as per the following criteria:

$$D302 \ll D304; (D304*5\%) \leq D302 \leq (D304*20\%) \quad (1)$$

$$145° \leq \Theta300 < 180° \text{ or } 0° > \Theta301 \geq 35° \quad (2)$$

Having established lateral offset D302 and routing angle Θ300, the length of segments D300 and D301 can be determined according to the following equation:

$$(D300 \approx D301) = \frac{D302}{\sin(180° - \Theta300)}$$

The triangular path includes segments D300 and D301 that are substantially equivalent in length. Segments D300 and D301 replace a portion of trace P 314 designated as D303. Accordingly, each triangular route will increase the length of trace P 314 by the following amount:

$$\text{Route\_Increase} = (D300 + D301) - D303$$

Furthermore, the length of replaced section D303 can be calculated using D300 and routing angle Θ300, as follows:

$$D303 = 2*(-D300*\cos\Theta300)$$

Accordingly, each pair of segments D300 and D301 will increase the overall length of trace P 314 by the following amount:

Route_Increase=(D300+D301)−[2*(−D300*cos Θ300)]

The number of triangular routes "N" (wherein each "N" is combination of a segment D300 and a segment D301) needed to compensate for the discrepancy in length (ΔLength) between the differential traces can be determined according to the following:

$$N = \frac{\Delta Length}{Route\_Increase}$$

Returning to FIG. 3, triangular routing 320 includes trough 318 between the triangular routes. In an alternative embodiment, trough 318 can be removed and segment D301 can be followed by another segment that is similar to D300. Thus, in one example, there need not be trough 318 between D301 and D300 segments. Triangular routing 320 is included only on trace P 314 for illustrative purposes only. One skilled in the art would recognize that triangular routing 320 can be used on either or both differential traces. Similarly, triangular routing 320 is not required to be collocated or isolated to a particular portion of the trace. Triangular routing 320 can be disjointed with one or more combinations of segments D300 and D301 inserted at different portions of the differential traces.

Triangular routing 320 is illustrated with straight segments D300 and D301. In alternative examples, D300 and D301 may be in the shape of a curve or arc. Alternatively, D300 and D301 may be straight segments that include slightly curved ends so that the corners where the trace segments D300 and D301 meet are rounded off.

Figure 4:
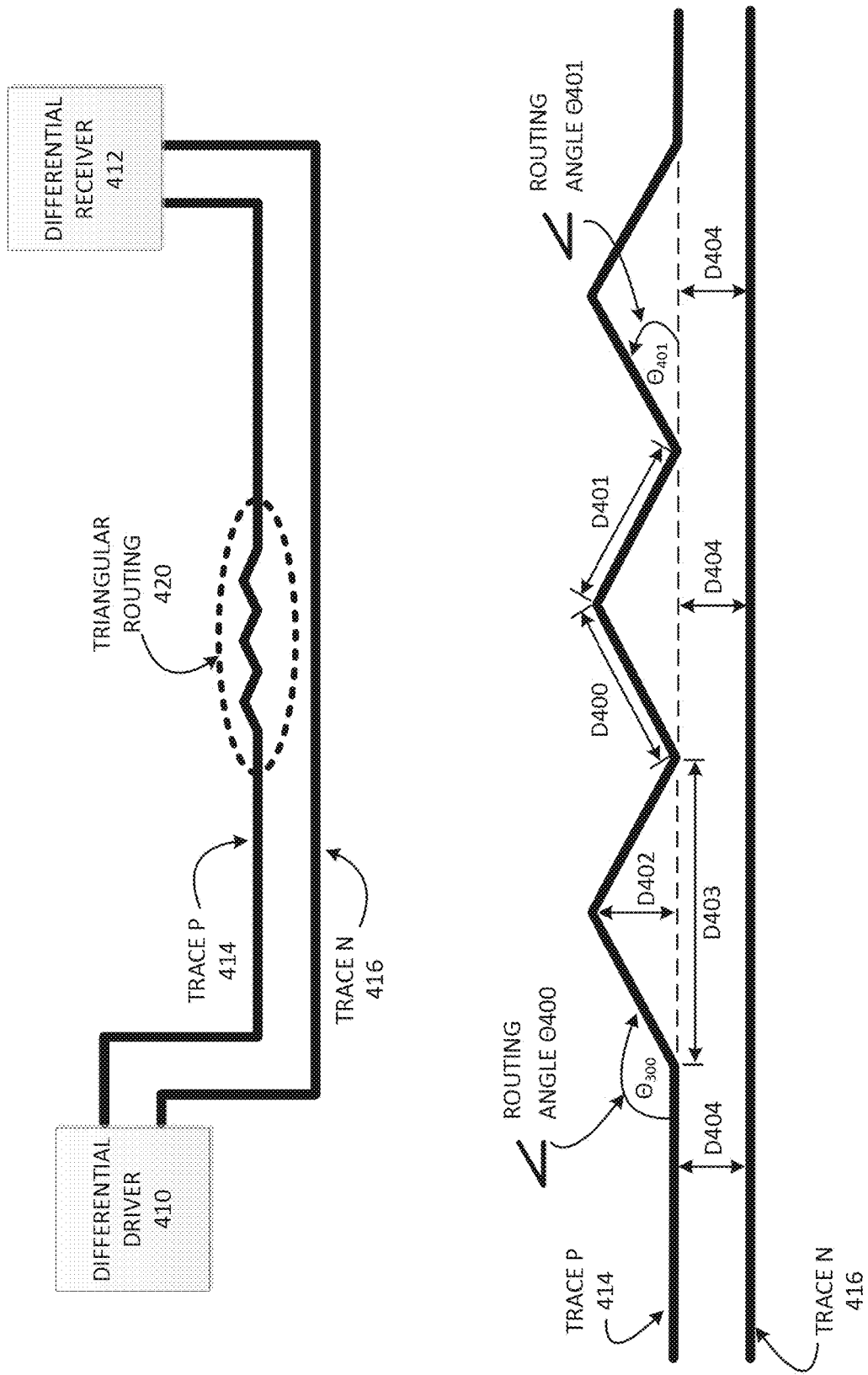
FIG. 4 illustrates another example differential signal interface using the triangular length matching technique of the present disclosure.

FIG. 4 illustrates another example of a differential pair interface with the disclosed triangular routing 420 technique of the present disclosure. Again, this example includes various turns in the routing paths between differential driver 410 and differential receiver 412. These turns cause trace N 416 to be longer than trace P 414. To compensate for the discrepancy in length, trace P 414 is modified to include triangular routing 420.

In FIG. 4, the first set of routing segments D400 and D401 are followed by a second set of routing segments D402 and D403 and a third set of routing segments D404 and D405. FIG. 4 illustrates an example of the disclosed triangular routing 420 that does not include any troughs between the triangular routes. One that is skilled in the art would recognize that any number of triangular routes can be used to achieve the desired length compensation and the troughs can be included between triangular routes if desired. Similar to FIG. 3, the lateral offset D402 and routing angles Θ400 and Θ401 can be used to determine the lengths and routing paths for routing segments D400, D401, D402, D403, D404, and D405.

Figure 5:
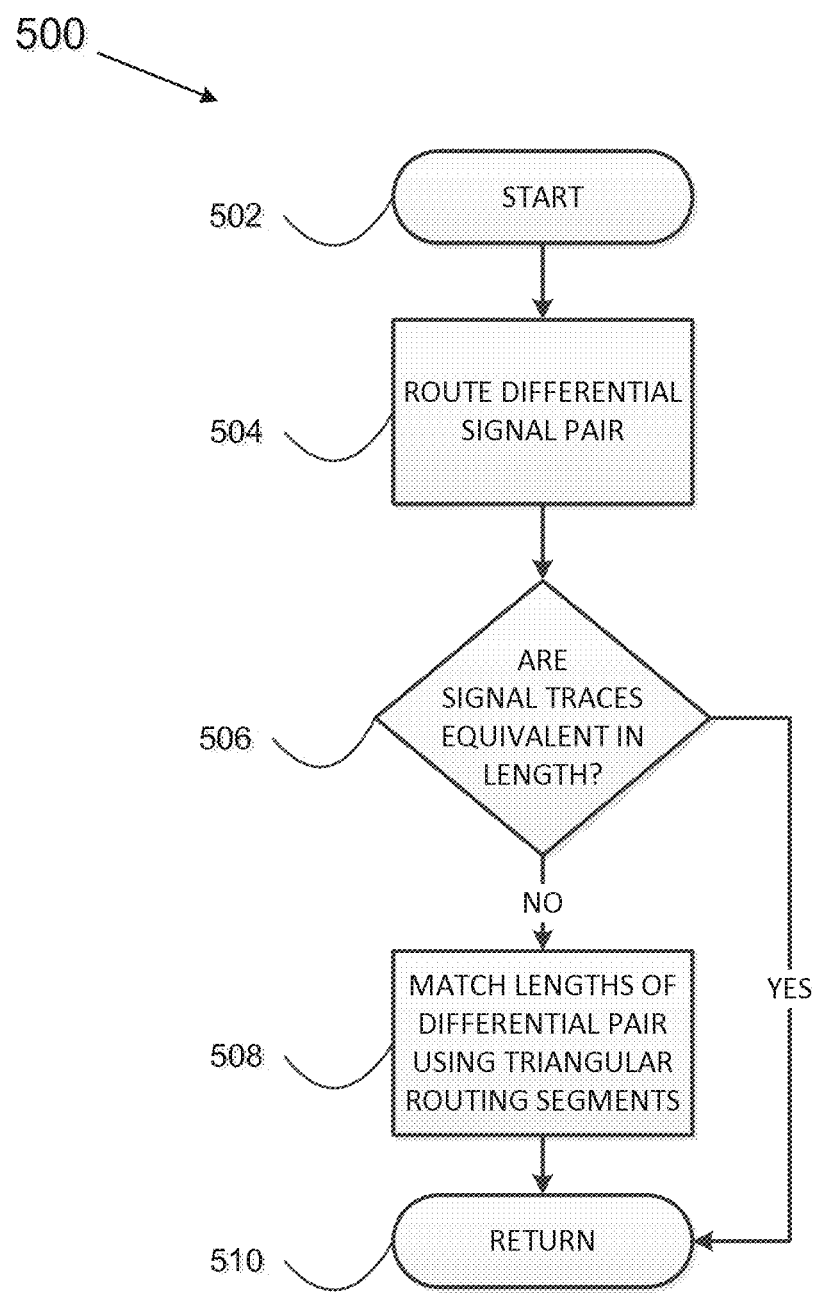
FIG. 5 illustrates an example method for implementing the triangular length matching technique of the present disclosure.

FIG. 5 illustrates an example method 500 for implementing differential pair length matching with triangular routing. Method 500 begins at step 502 and continues to step 510. At step 504, a differential pair is routed from differential driver 310 to differential receiver 312. The signal pair is routed along substantially parallel conductive paths with a relatively consistent spacing between the conductive paths. The differential pair is routed from differential driver 310 to differential receiver 320. The differential pair may be routed on a PCB or on a substrate of an integrated circuit.

After the differential pair is routed at step 504, the method continues to step 506 where the lengths of the respective conductive paths are evaluated. If the differential pair signal traces are substantially equivalent in length, the method ends at step 510. However, if the differential pair signal traces have differing lengths, the method continues to step 508. A difference in length can be caused by one or more turns in the routing of the conductive paths. These turns can be due to the restrictions of the design resulting from a densely populated printed circuit board.

At step 508, the lengths of the differential pair signal traces are matched using triangular routing techniques of the present disclosure. The differential line spacing is used to determine a lateral offset for the triangular routing. A suitable routing angle for the triangular segments is also selected. These parameters are then used to determine the length of the triangular segments and the increase in routing length provided by each triangular routing path. The discrepancy in the length of the differential pair signal traces can then be adjusted by inserting an appropriate number of triangular routes that satisfy the selected parameters.

After the triangular routing segments are inserted, the differential pair signal traces will be substantially equivalent in length. The method will continue to step 510, where it returns to previous processing, including repeating method 500.

Figure 6:
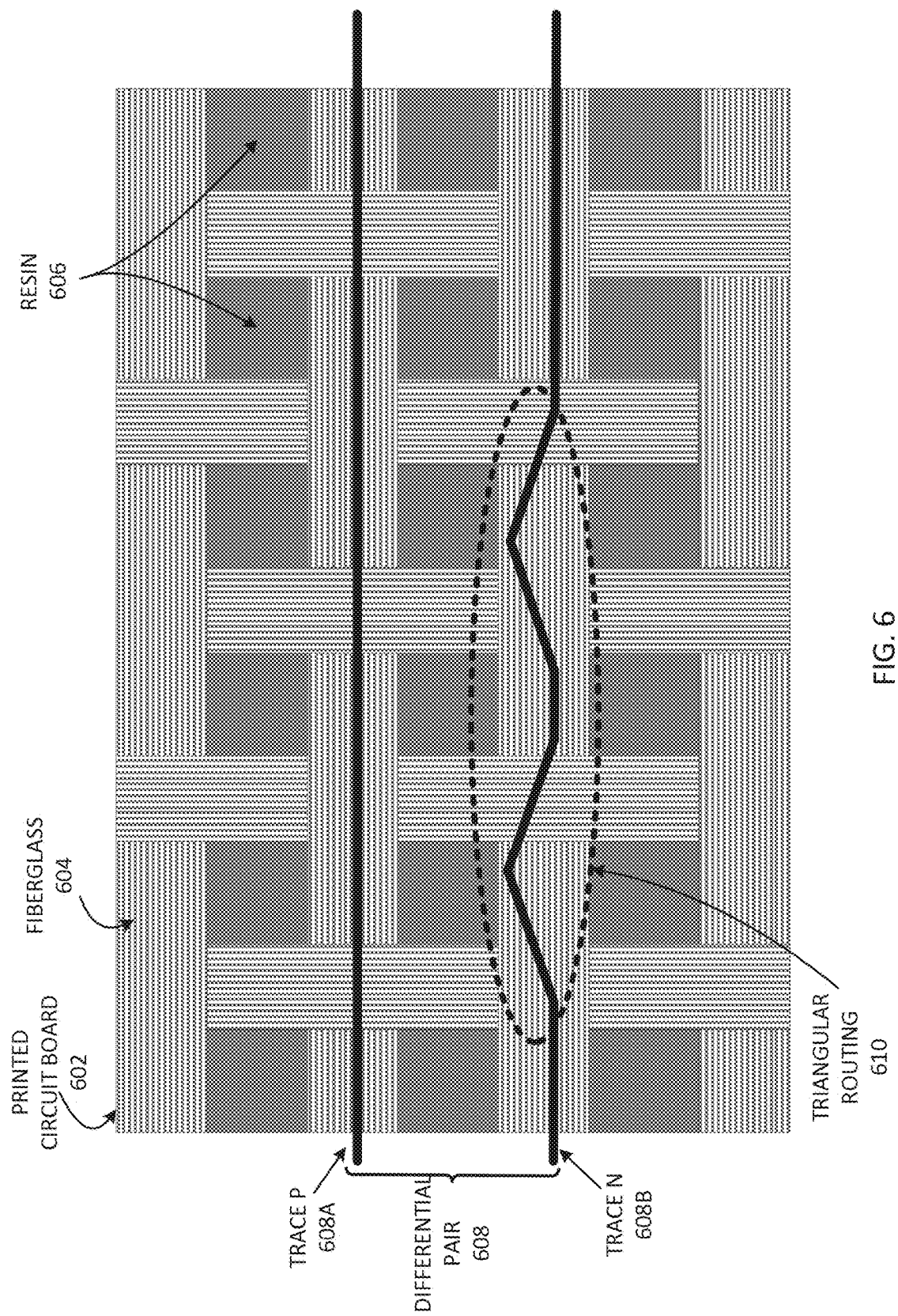
FIG. 6 illustrates an example of triangular routing on a printed circuit board utilizing the methods of the present disclosure.

FIG. 6 illustrates an example of triangular routing 610 on printed circuit board 602 using the principles of the present disclosure. Printed circuit board 602 is made up of fiberglass 604 that is woven into cloth and impregnated with resin 606. The content of resin 606 can vary according to the process used in constructing the laminate. The weave pattern of fiberglass 604 and resin 606 can result in non-homogenous material that causes variation in the dielectric constant. This is known as the fiber weave effect.

In FIG. 6, there is a set of differential signal pair traces, differential pair 608. Differential pair 608 includes length matching to compensate for a difference in length (not shown) between their corresponding traces. Differential pair 608 includes trace P 608A and trace N 608B. Both of these traces are routed over fiberglass 604 to avoid impedance mismatch caused by the fiber weave effect. However, trace N 608B has been modified to include triangular routing 610. The lateral offset and the routing angle used as part of the triangular routing 610 technique allows trace N 608B to stay within fiberglass 604 and avoid routing over resin 606. Accordingly, differential pair 608 will have proper length matching between trace P 608A and trace N 608B and will not be affected by the fiber weave effect.

Figure 7:
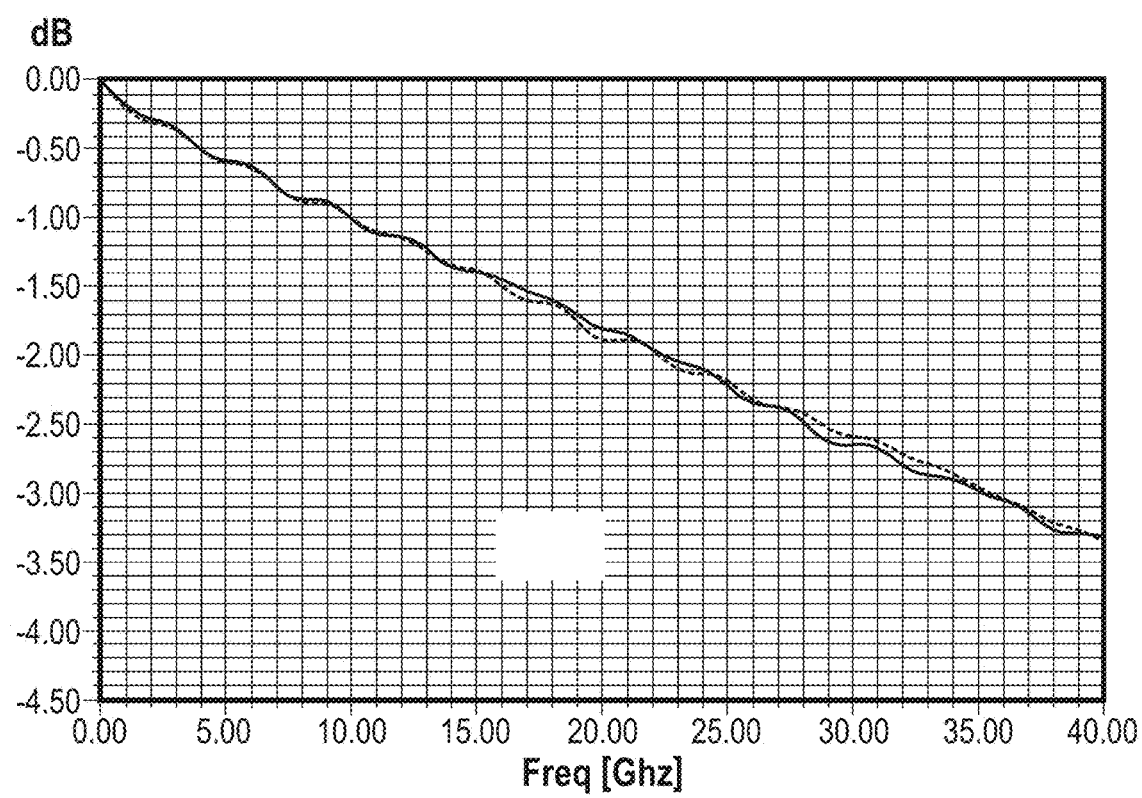
FIG. 7 illustrates examples of the insertion loss observed using the triangular length matching technique of the present disclosure.
Figure 7:
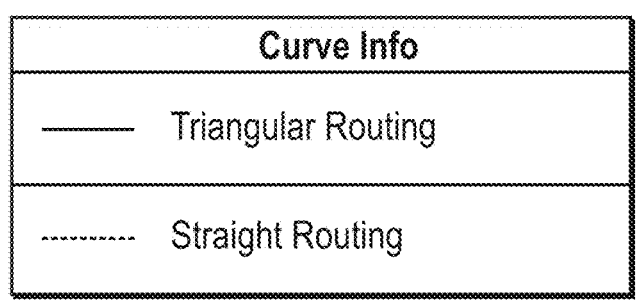

FIG. 7 is a graphical representation of the insertion loss observed when using the triangular routing method of the present disclosure as compared to an optimally routed straight line differential pair of equivalent length. The insertion loss was modeled using a computer simulation tool on two sets of differential pairs. Each of the differential pairs was set up with equal one inch lengths on both signals. Additional parameters of the simulation included a trace width of 6.5 mils, edge to edge trace spacing of 10.75 mils, dielectric constant of 3.6, loss tangent of 0.015, and dielectric material thickness of 5 mils (trace to ground).

In the straight routing case, the differential pair was routed in an ideal fashion with both of the conductive paths routed using straight, parallel lines. The straight routing case does not include any length matching segments. The triangular routing differential pair was routed to include a portion of length matching on one of the signals. In particular, 0.63 inches (63%) of the 1 inch length were routed using the triangular routing technique.

FIG. 7 illustrates that the triangular routing technique can result in an insertion loss that is nearly equivalent to the ideal straight routing technique. This result highlights a significant advantage of using triangular routing over other techniques for matching the length of differential signal pair traces. Triangular routing allows for the addition of the necessary length while exhibiting electrical properties nearly equivalent to an ideal straight line route.

Figure 8:
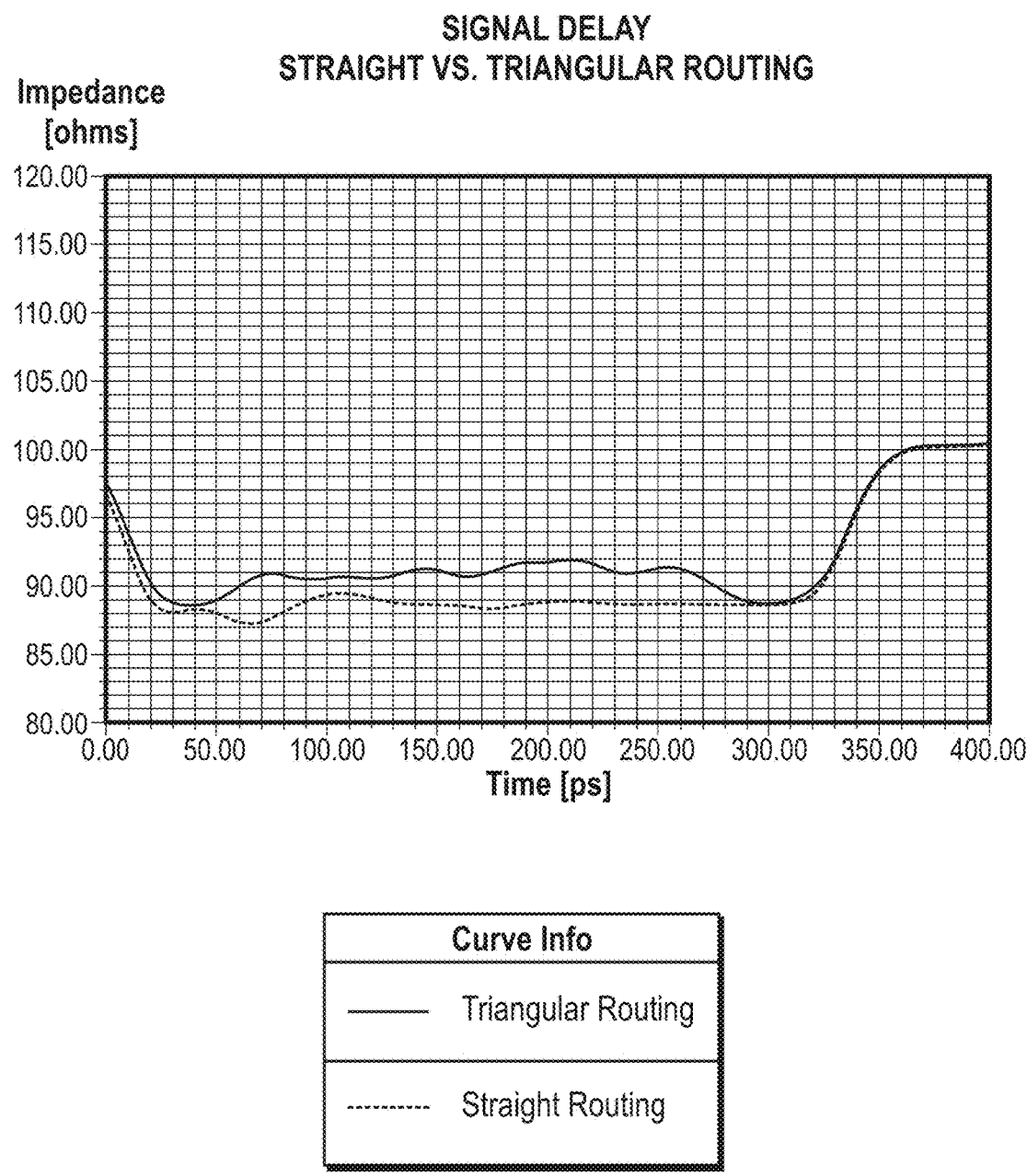
FIG. 8 illustrates an example of the signal delay induced using the triangular length matching technique of the present disclosure.

FIG. 8 illustrates the signal delay observed when using triangular routing as compared to an optimally routed straight line differential pair of equivalent length. FIG. 8 is a graphical representation of the end to end differential impedance as a function of time for each of the differential pairs, which is measured using a time-domain reflectometer (TDR). The signal delay observed on the TDR plot was modeled using a computer simulation tool on two sets of differential pairs. The simulation for FIG. 8 was configured in the same manner as the simulation for FIG. 7. The simulation used equal one inch lengths on each of the two traces corresponding to the two differential pairs and the same parameters (width, spacing, dielectric constant, loss tangent, and thickness) set forth above for FIG. 7.

Once again, in the straight routing case the differential pair was routed in an ideal fashion with both of the conductive paths routed as straight, parallel lines each one inch in length. The triangular routing case includes a length matching portion totaling 0.63 inches in length on one of its differential traces.

FIG. 8 illustrates how the triangular routing technique avoids problems associated with self-coupling. The curves for both the straight routing and the triangular routing overlap substantially at times past 290 ps on the X-axis, where the differential traces reach their destination. Self-coupling associated with alternative length matching techniques cause the trace that has the length matching routing to have a shorter delay than the straight trace. Triangular routing avoids this problem and can perform in a manner that is nearly equivalent to the optimal straight routing approach. Note that the results illustrated in FIG. 7 and FIG. 8 are associated with the parameters used for the simulation. Consequently, the performance of triangular routing can vary according to changes in those parameters.

For clarity of explanation, in some instances the present technology may be presented as including individual functional blocks including functional blocks comprising devices, device components, steps or routines in a method embodied in software, or combinations of hardware and software.

Note that in certain example implementations, the optimization and/or placement functions outlined herein may be implemented by logic encoded in one or more tangible, non-transitory media (e.g., embedded logic provided in an application specific integrated circuit [ASIC], digital signal processor [DSP] instructions, software [potentially inclusive of object code and source code] to be executed by a processor, or other similar machine, etc.). The computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

It is also important to note that the steps for optimization and/or placement described herein illustrate only some of the possible signaling scenarios and patterns that may be executed by a computing system. Some of these steps may be deleted or removed where appropriate, or these steps may be modified or changed considerably without departing from the scope of the present disclosure. In addition, a number of these steps have been described as being executed concurrently with, or in parallel to, one or more additional operations. However, the timing of these steps may be altered considerably. The preceding operational flows have been offered for purposes of example and discussion.

Although the present disclosure has been described in detail with reference to particular arrangements and configurations, these example configurations and arrangements may be changed significantly without departing from the scope of the present disclosure. For example, although the present disclosure has been described with reference to data centers, it may be applicable to other computing systems and architectures.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more."

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

The word "substantially" is used herein to mean "to a significant extent." Quantitatively, the word "substantially" means greater than or equal to 80%.

What is claimed is:

1. A method comprising:
   determining, by a processor, that a first length of a first signal trace of a differential pair is longer than a second length of a second signal trace of the differential pair, wherein the first signal trace and the second signal trace are routed on respective conductive paths; and
   replacing, by the processor, one or more sections of the second signal trace with a first line segment and a second line segment that form a triangular vertex in order to match the second length of the second signal trace with the first length of the first signal trace;
   wherein the first line segment and the second line segment define a lateral deviation from the replaced one or more sections, wherein the lateral deviation is less than a spacing between the first signal trace and the second signal trace.

2. The method of claim 1, wherein
   the first line segment and the second line segment extend the second signal trace in a direction away from the first signal trace, and
   a first angle exists between the first line segment and a line corresponding to the replaced one or more sections and a second angle exists between the second line segment and the line corresponding to the replaced one or more sections.

3. The method of claim 2, wherein the first angle and the second angle are substantially equal.

4. The method of claim 2, wherein the first angle and the second angle are between 0 degrees and 35 degrees.

5. The method of claim 2, further comprising:
   subtracting the second length from the first length to determine a compensation length;
   determining a permitted lateral deviation using a spacing between the first signal trace and the second signal trace;
   determining a length for the first line segment and the second line segment, wherein the length is based on the permitted lateral deviation and the first angle;
   determining a number of sections to replace on the second signal trace to achieve the compensation length.

6. The method of claim 5, wherein the permitted lateral deviation is between 5% and 20% of the spacing between the first signal trace and the second signal trace.

7. The method of claim 1, wherein the first signal trace and the second signal trace are routed on a substrate of an integrated circuit.

8. The method of claim 1, wherein the replacing comprises replacing at least two sections of the second signal trace with a first line segment and a second line segment that form a triangular vertex, and at least two adjacent ones of the at least two sections of the second signal trace are separated by a section that is parallel to the first signal trace.

9. An apparatus, comprising:
   a first signal trace; and
   a second signal trace, the second signal trace including one or more length matching sections, the one or more length matching sections including:
      a first line segment having a first end and a second end; and
      a second line segment having a first end and a second end, the second end of the first line segment meeting the first end of the second line segment to create a triangular vertex, wherein the second signal trace forms a lateral deviation with respect to the first signal trace;
   wherein the first line segment and the second line segment define a lateral deviation from the replaced one or more sections, wherein the lateral deviation is less than a spacing between the first signal trace and the second signal trace.

10. The signal transmission apparatus of claim 9, wherein the first line segment and the second line segment replace a portion of the second signal trace,
    a first routing angle exists between the first line segment and a line corresponding to the replaced portion, and
    the first routing angle is between 0 degrees and 35 degrees.

11. The signal transmission apparatus of claim 9, wherein the one or more length matching segments cause the first signal trace and the second signal trace to have substantially equal lengths.

12. The signal transmission apparatus of claim 9, wherein
    the apparatus is a printed circuit board including one or more pockets of resin material, and
    the first line segment and the second line segment do not overlap the one or more pockets of resin material.

13. The signal transmission apparatus of claim 12, wherein the printed circuit board comprises a plurality of routing layers and wherein the first signal trace and the second signal trace are routed on one or more of the plurality of routing layers.

14. The apparatus claim 9, wherein at least two adjacent ones of the length matching sections of the second signal trace are separated by a section that is parallel to the first signal trace.

15. A non-transitory computer-readable storage medium having stored therein instructions which, when executed by a processor, cause the processor to perform operations comprising:
    determining, by a processor, that a first length of a first signal trace of a differential pair is longer than a second length of a second signal trace of the differential pair, wherein the first signal trace and the second signal trace are routed on respective conductive paths; and
    replacing, by the processor, one or more sections of the second signal trace with a first line segment and a second line segment that form a triangular vertex in order to match the second length of the second signal trace with the first length of the first signal trace;

wherein the first line segment and the second line segment define a lateral deviation from the replaced one or more sections, wherein the lateral deviation is less than a spacing between the first signal trace and the second signal trace.

16. The non-transitory computer-readable medium of claim 15, wherein
the first line segment and the second line segment extend the second signal trace in a direction away from the first signal trace, and
a first angle exists between the first line segment and a line corresponding to the replaced one or more sections and a second angle exists between the second line segment and the line corresponding to the replaced one or more sections.

17. The non-transitory computer-readable medium of claim 16, wherein
the first angle and the second angle are substantially equivalent, and
the first angle and the second angle are between 0 degrees and 35 degrees.

18. The non-transitory computer-readable medium of claim 16, further comprising: subtracting the second length from the first length to determine a compensation length;
determining a permitted lateral deviation using a spacing between the first signal trace and the second signal trace;
determining a length for the first line segment and the second line segment, wherein the length is based on the permitted lateral deviation and the first angle;
determining a number of sections to replace on the second signal trace to achieve the compensation length.

19. The non-transitory computer-readable medium of claim 18, wherein the permitted lateral deviation is between 5% and 20% of the spacing between the first signal trace and the second signal trace.

20. The medium of claim 15, wherein the replacing comprises replacing at least two sections of the second signal trace with a first line segment and a second line segment that form a triangular vertex, and at least two adjacent ones of the at least two sections of the second signal trace are separated by a section that is parallel to the first signal trace.

* * * * *